(12) United States Patent
Wu et al.

(10) Patent No.: US 10,903,564 B2
(45) Date of Patent: Jan. 26, 2021

(54) COMMUNICATION APPARATUS

(71) Applicant: PEGATRON CORPORATION, Taipei (TW)

(72) Inventors: Chien-Yi Wu, Taipei (TW); Huan-Chia Chang, Taipei (TW); Chao-Hsu Wu, Taipei (TW); Shih-Keng Huang, Taipei (TW); Chia-Chou Tsai, Taipei (TW); Yu-Yi Chu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 3 days.

(21) Appl. No.: 16/363,893

(22) Filed: Mar. 25, 2019

(65) Prior Publication Data
US 2019/0363436 A1 Nov. 28, 2019

(30) Foreign Application Priority Data

May 25, 2018 (TW) .............................. 107118031 A

(51) Int. Cl.
| | |
|---|---|
| *H01Q 1/52* | (2006.01) |
| *H05K 5/00* | (2006.01) |
| *H05K 9/00* | (2006.01) |
| *H01Q 1/22* | (2006.01) |
| *H01Q 1/24* | (2006.01) |
| *G06F 1/16* | (2006.01) |

(52) U.S. Cl.
CPC ........... *H01Q 1/528* (2013.01); *H01Q 1/2266* (2013.01); *H01Q 1/243* (2013.01); *H05K 5/0017* (2013.01); *H05K 9/0054* (2013.01); *G06F 1/1656* (2013.01); *G06F 1/1698* (2013.01)

(58) Field of Classification Search
CPC ...... H01Q 1/528; H01Q 1/2266; H01Q 1/243; H01Q 1/526; H01Q 1/48; H01Q 1/52; H05K 5/0017; H05K 9/0054; G06F 1/1698; G06F 1/1656; G06F 1/1626; H04W 88/02
See application file for complete search history.

(56) References Cited

U.S. PATENT DOCUMENTS 8,526,170 B2 9/2013 Nishikawa et al.
9,223,342 B2 12/2015 Chang et al.
(Continued)

FOREIGN PATENT DOCUMENTS

CN 101523662 9/2009
CN 106992360 7/2017
(Continued)

*Primary Examiner* — Dameon E Levi
*Assistant Examiner* — David E Lotter
(74) *Attorney, Agent, or Firm* — J.C. Patents

(57) ABSTRACT

A communication apparatus is provided. A retaining wall structure electrically connected with a ground plane is disposed between a main circuit board and an antenna. A retaining wall part of the retaining wall structure has a thickness. A distance between the retaining wall part and the main circuit board is a first distance, and a distance between the retaining wall part and the antenna and is a second distance. A distance between the retaining wall and a shielding metal plate is a third distance. The projection of the antenna projected toward the retaining wall in the orthogonal projection direction falls on the retaining wall part.

16 Claims, 9 Drawing Sheets

(56) References Cited

U.S. PATENT DOCUMENTS

| | | | |
|---|---|---|---|
| 2002/0022459 A1* | 2/2002 | Kobayashi | H04B 1/3833 455/575.7 |
| 2007/0152889 A1 | 7/2007 | Chen et al. | |
| 2008/0100521 A1 | 5/2008 | Herbert et al. | |
| 2015/0133188 A1 | 5/2015 | Chang et al. | |
| 2016/0006109 A1 | 1/2016 | Apaydin et al. | |

FOREIGN PATENT DOCUMENTS

| | | |
|---|---|---|
| CN | 107887698 | 4/2018 |
| TW | M294677 | 7/2006 |
| TW | I497931 | 8/2015 |
| TW | 201814958 | 4/2018 |

\* cited by examiner

COMMUNICATION APPARATUS

CROSS-REFERENCE TO RELATED APPLICATION

This application claims the priority benefit of Taiwan application serial no. 107118031, filed on May 25, 2018. The entirety of the above-mentioned patent application is hereby incorporated by reference herein and made a part of this specification.

BACKGROUND

Technical Field

The application relates to an electronic apparatus and more particularly, to a communication apparatus.

Description of Related Art

Generally, an antenna of a wireless communication apparatus (for example, a notebook computer, a tablet computer or a cell phone . . . etc.) is usually disposed at a position opposite to a position of a screen. For example, the screen may be disposed on a top cover of the communication apparatus, and the antenna may be disposed on a bottom cover of the communication apparatus. Additionally, for the wireless communication apparatus to have preferable communication quality, a metal shielding region located on the top cover is connected to a system ground plane located on the bottom cover through a mechanical member, such as a screw or a gasket, to constitute a complete ground plane. In this way, noise generated by a main circuit board of the communication apparatus may be prevented from affecting the antenna performance. However, because in part of the communication apparatuses, the metal shielding region of the top cover is distant from the system ground plane of the bottom cover by a greater distance (which may be, for example, greater than 18 mm), and as a result, it becomes much more difficult for bonding the ground plane.

SUMMARY

The application provides a communication apparatus capable of effectively preventing noise generated by a main circuit board of the communication apparatus from affecting antenna performance to enhance communication quality of the communication apparatus.

A communication apparatus of the application includes a display panel, a ground plane, a shielding metal plate, a main circuit board, an antenna and a retaining wall structure. The ground plane is disposed opposite to the display panel. The shielding metal plate is located between the display panel and the ground plane and is stacked on the display panel. The main circuit board is located between the shielding metal plate and the ground plane and is stacked on the ground plane. The retaining wall structure is disposed between the main circuit board and the antenna and is electrically connected with the ground plane. The retaining wall structure includes a retaining wall part. The retaining wall part has a thickness. The retaining wall part is distant from the main circuit board by a first distance and distant from the antenna by a second distance. The retaining wall part is distant from the shielding metal plate by a third distance. A projection of the antenna toward the retaining wall part in an orthogonal projection direction falls on the retaining wall part.

In an embodiment of the application, the retaining wall structure is formed by bending a first metal sheet. The retaining wall part has an inverted U-shaped structure, and the inverted U-shaped structure includes a first side portion, a second side portion and a top portion. A distance between the first side portion and the second side portion is equal to the thickness. The retaining wall structure further includes a first connection part and a second connection part. The first connection part is electrically connected with the ground plane and the first side portion. The second connection part is electrically connected with the second side portion and the antenna, wherein first side portion is distant from the main circuit board by the first distance, the second side portion is distant from the antenna by the second distance, and the top portion is distant from the shielding metal plate by a third distance.

In an embodiment of the application, the second side portion and an edge of the shielding metal plate are aligned with each other in a normal direction of the display panel.

In an embodiment of the application, the communication apparatus further includes a printed circuit board, and the antenna is formed on the printed circuit board.

In an embodiment of the application, a height of the retaining wall structure is greater than a height of the printed circuit board by at least one preset height.

In an embodiment of the application, the preset height is 5 millimeters (mm).

In an embodiment of the application, the communication apparatus further includes a second metal sheet disposed opposite to the top portion and is electrically connected with the ground plane, the first connection part and the second connection part.

In an embodiment of the application, the thickness is greater than or equal to 5 mm.

In an embodiment of the application, the first distance and the second distance are greater than or equal to 5 mm.

In an embodiment of the application, the third distance is greater than 0 mm and is less than or equal to 3 mm.

To sum up, in the embodiments of the application, the retaining wall structure electrically connected with the ground plane are disposed between the main circuit board and the antenna, so as to prevent the noise generated by the main circuit board of the communication apparatus from affecting the antenna performance to enhance the communication quality of the communication apparatus.

In order to make the aforementioned and other features and advantages of the application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF EMBODIMENTS

Figure 1:
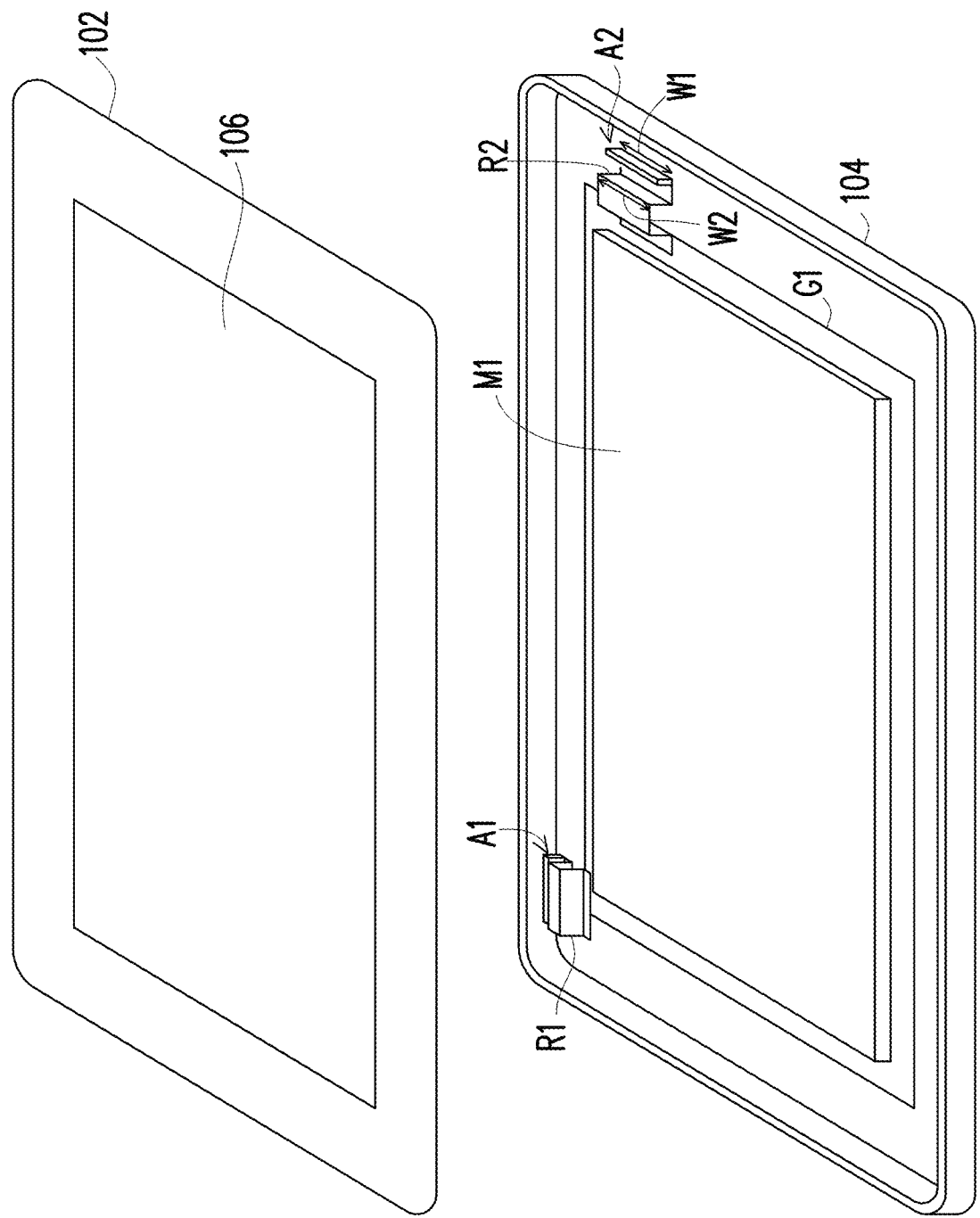
FIG. 1 is a schematic diagram illustrating a communication apparatus according to an embodiment of the application.

FIG. 1 is a schematic diagram illustrating a communication apparatus according to an embodiment of the application. Referring to FIG. 1, the communication apparatus may be, for example, a cell phone, a template computer or an all in one desktop computer, but the application is not limited thereto. The communication apparatus includes a top cover 102, a bottom cover 104, a display panel 106, a shielding metal plate S1 (referring to FIG. 2), a main circuit board M1, a ground plane G1, antennas A1 and A2 and retaining wall structures R1 and R2. When the top cover 102 is fastened to the bottom cover 104, a space included by the top cover 102 and the bottom cover 104 may be used to accommodate the display panel 106, the main circuit board M1, the ground plane G1, the antennas A1 and A2 and the retaining wall structures R1 and R2. The display panel 106 and the shielding metal plate S1 are disposed on the top cover 102, and the top cover 102 has an opening, such that when the display panel 106 is fastened to the top cover 102, a display surface of the display panel 106 is exposed from the opening. The main circuit board M1, the ground plane G1, the antennas A1 and A2 and the retaining wall structures R1 and R2 are disposed on the bottom cover 104. As illustrated in FIG. 1, the main circuit board M1 is stacked on the ground plane G1, the retaining wall structure R1 and the antenna A1 are disposed at the upper left of the ground plane G1, and the retaining wall structure R2 and the antenna A2 are disposed at the upper right of the ground plane G1. The retaining wall structure R1 is disposed between the main circuit board M1 and the antenna A1, and the retaining wall structure R2 is disposed between the main circuit board M1 and the antenna A2.

Figure 2:
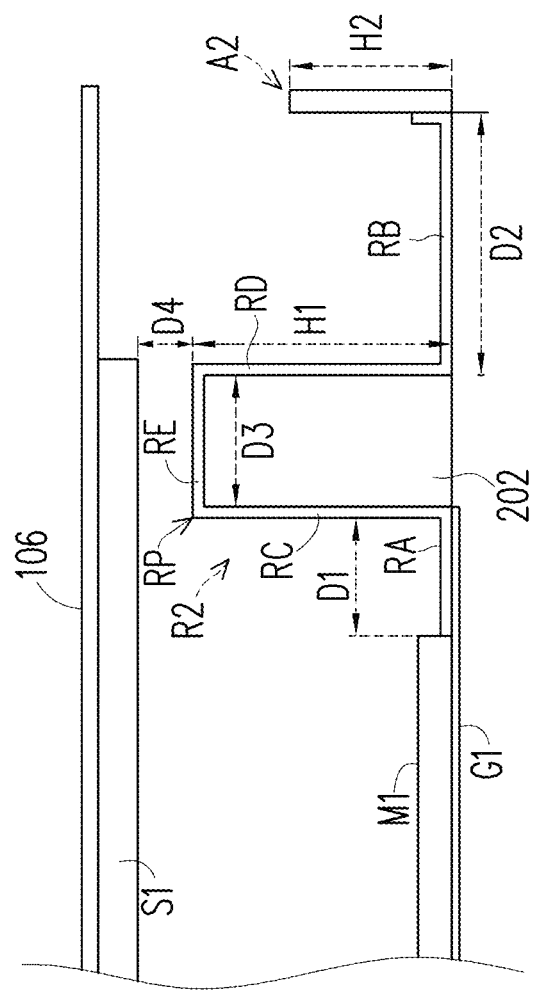
FIG. 2 is a schematic configuration diagram illustrating the retaining wall structure and the antennas according to an embodiment of the application.

FIG. 2 is a schematic configuration diagram illustrating the retaining wall structure and the antennas according to an embodiment of the application. Hereinafter, the retaining wall structure R2 and the antenna A2 are taken as an example for further describing the configuration of the retaining wall structure and the antenna. As illustrated in FIG. 2, the display panel 106 is disposed opposite to the ground plane G1, the shielding metal plate S1 is located between the display panel 106 and the ground plane G1, and the shielding metal plate S1 is stacked on the display panel 106. In the present embodiment, the retaining wall structure R2 is formed by bending a metal sheet and may include connection parts RA and RB and a retaining wall part RP having an inverted U-shaped structure. The retaining wall part RP may include side portions RC and RD and a top portion RE. The connection part RA is electrically connected with the ground plane G1 and the side portion RC, the connection part RB is electrically connected with the side portion RD and the antenna A2 (for example, electrically connected with a ground element of the antenna A2), the side portion RC is distant from the main circuit board M1 by a distance D1, and the side portion RB is distant from the antenna A2 by a distance D2. In addition, the retaining wall part RP has a thickness D3 (i.e., the side portions RC and RD are distant from each other by a thickness D3), and the top portion RE of the retaining wall part RP is distant from the shielding metal plate S1 by a distance D4. The metal sheet forming the retaining wall structure R2 may be implemented by an aluminum foil. For example, the retaining wall part RP having the inverted U-shaped structure may be formed by means of attaching an aluminum foil to a hard sponge 202. In other embodiments, the metal sheet may also be implemented by other kinds of metal, for example, an aluminum sheet or a copper sheet (but the application is not limited thereto). When the aluminum sheet or the copper sheet is used for the implementation, the use of the hard sponge 202 for supporting the metal sheet may be omitted, or alternatively, the retaining wall part RP may be implemented by a solid metal block.

In the present embodiment, the antenna A2 is implemented by means of printing an antenna pattern on a printed circuit board. The printed circuit board is disposed in parallel to the retaining wall part RP (however, the application is not limited thereto, and in other embodiments, the printed circuit board and the retaining wall part RP may be disposed with an included angle therebetween less than 180 degrees). As illustrated in FIG. 1, a projection of the antenna A2 toward the retaining wall part RP in an orthogonal projection direction completely falls on the retaining wall part RP. For example, a width W1 of the printed circuit board may be, for example, equal to a width W2 of the retaining wall part RP, and a height H2 of the printed circuit board may be less than or equal to a height H1 of the retaining wall part RP, which may be less than the height H1, for example, by at least one preset height (e.g., 5 mm) of the retaining wall part RP, but the application is not limited thereto. In addition, the side portion RD of the retaining wall part RP may be, for example, disposed by means of being aligned with an edge of the shielding metal plate S1 in a normal direction of the display panel 106, but the application is not limited thereto. In part of the embodiments, the side portion RD may also be more adjacent to the antenna A2 than the edge of the shielding metal plate S1. Namely, the overall retaining wall part RP moves rightward to be more adjacent to the antenna A2, and in a premise that it is permissible for an accommodation space of the communication apparatus. Thus, noise generated by the main circuit board of the communication apparatus may be prevented from affecting antenna performance in this way, so as to enhance communication quality of the communication apparatus.

Figure 3:
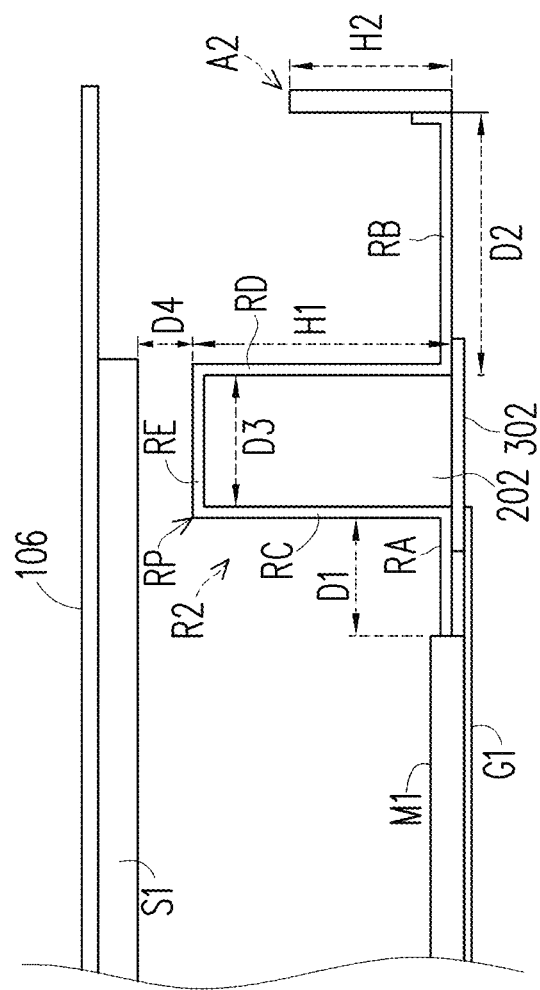
FIG. 3 is a schematic configuration diagram illustrating the retaining wall structure and the antennas according to another embodiment of the application.

FIG. 3 is a schematic configuration diagram illustrating the retaining wall structure and the antennas according to another embodiment of the application. Referring to FIG. 3, the difference between the present embodiment and the embodiment illustrated in FIG. 2 lies in the retaining wall structure of the present embodiment further including a metal sheet 302 which is disposed opposite to the top portion RE of the retaining wall part RP and is electrically connected with the ground plane G1, the connection part RA and the connection part RB, such that the retaining wall part RP has a rectangular structure.

Because the implementation manners of the retaining wall structure R1 and the antenna A1 are similar to those of the retaining wall structure R2 and the antenna A2, the implementation details of the retaining wall structure R1 and the antenna A1 may be clearly understood by the persons skilled in the art according to the related descriptions and thus, will not be repeatedly described.

In addition, to be detailed, the distances D1 and D2 and the thickness D3 may be set to be, for example, greater than or equal to 5 mm, and the distance D4 may be set to be, for example, greater than 0 mm and less than or equal to 3 mm to effectively prevent the noise generated by the main circuit board of the communication apparatus from effecting the antenna performance, so as to enhance the communication quality of the communication apparatus.

For example, in the embodiment depicted in FIG. 1, the distances D1 and D2 corresponding to the retaining wall structure R1 and the antenna A1, the thickness D3, the distance D4, the height H1 and the width of the retaining wall part RP may be set to 7 mm, 5 mm, 5 mm, 3 mm, 15 mm and 35 mm, respectively. The distances D1 and D2 corresponding to the retaining wall structure R2 and the antenna A2, the thickness D3, the distance D4, the height H1 and the width of the retaining wall part RP may be set to 7 mm, 15 mm, 7 mm, 3 mm, 15 mm and 35 mm, respectively.

Figure 4:
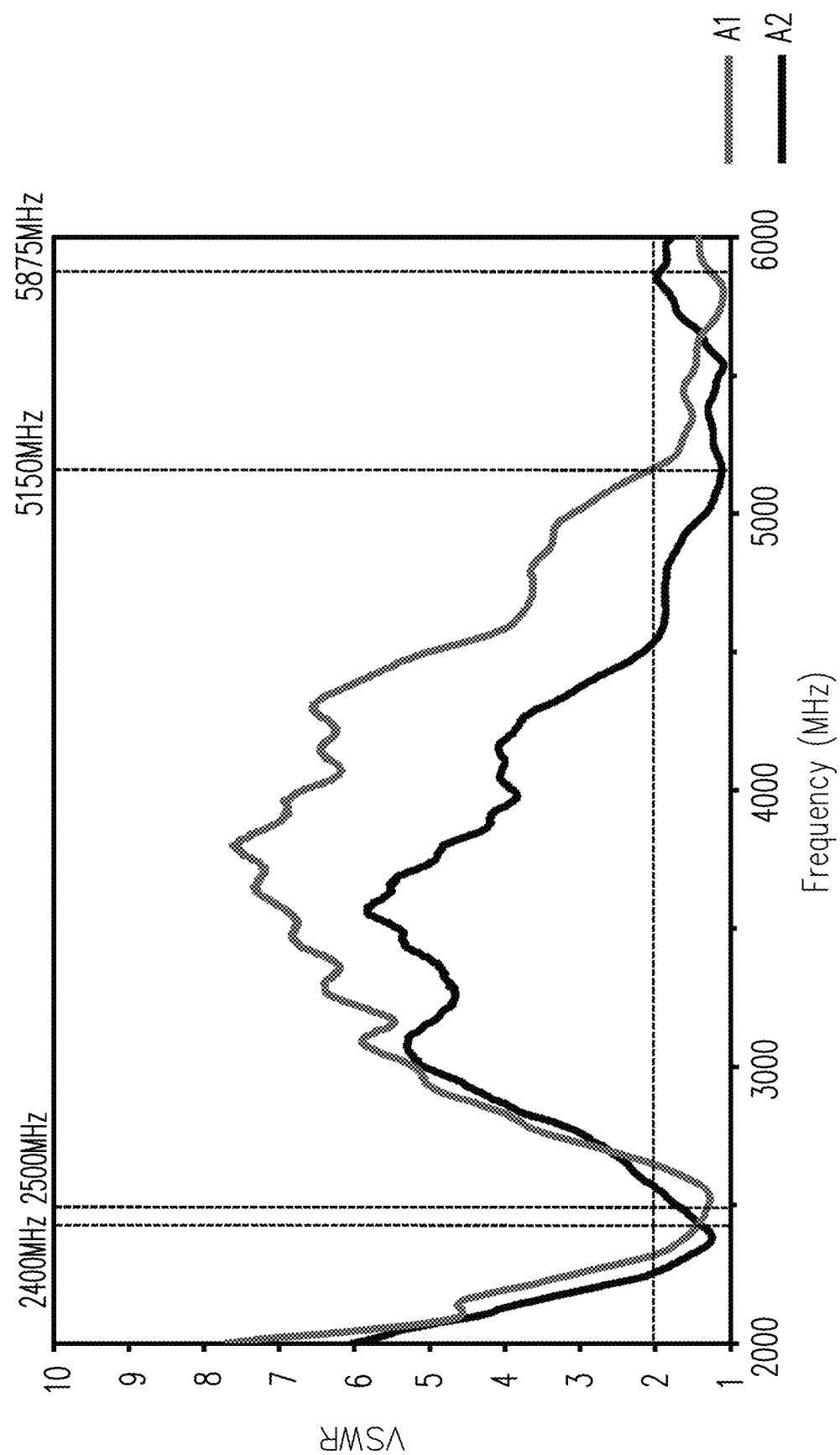
FIG. 4 is a graph illustrating voltage standing wave ratios (VWSRs) with respect to a frequency change for the antenna A1 and the antenna A2 of the embodiment depicted in FIG. 1.
Figure 5:
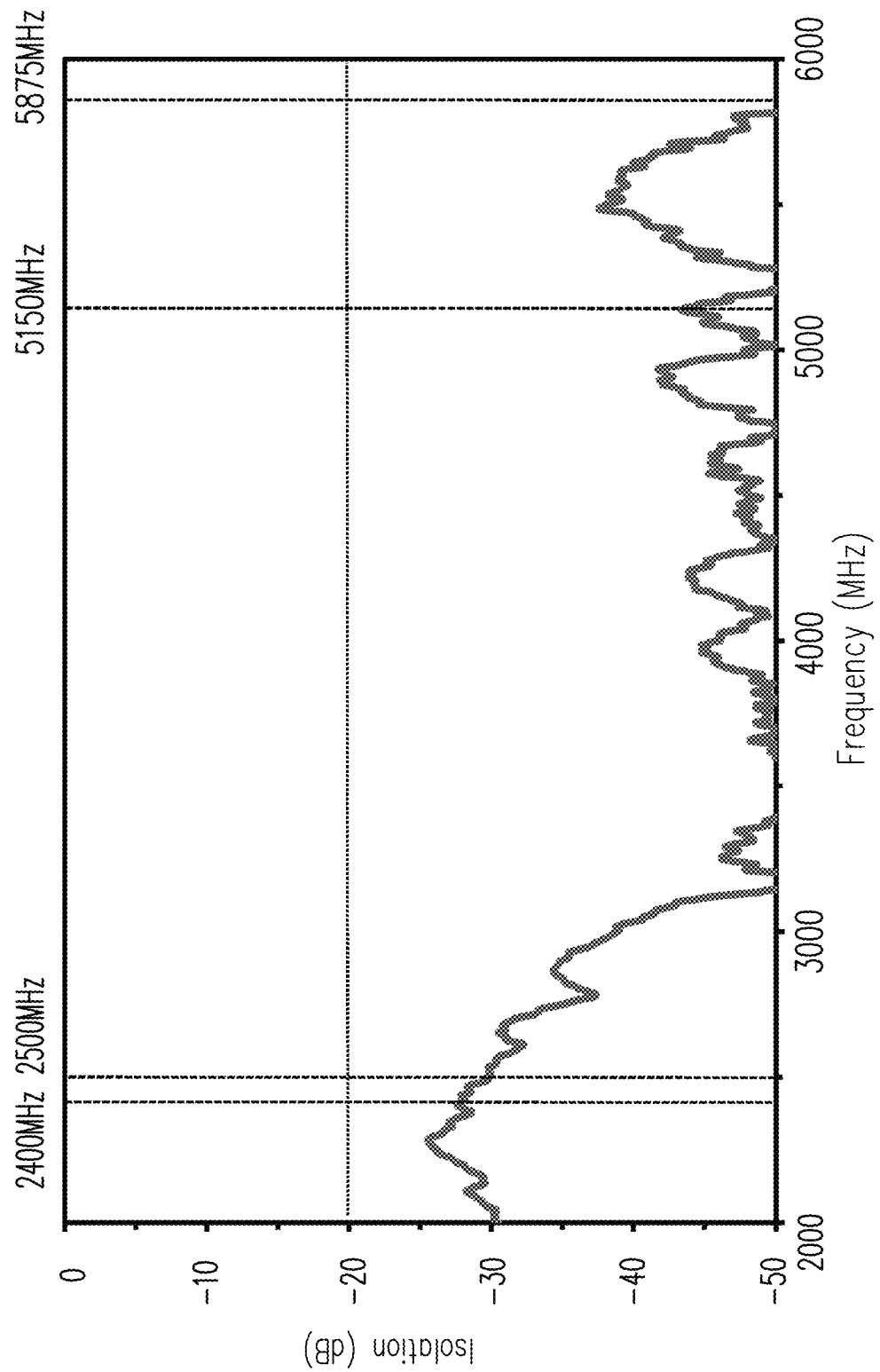
FIG. 5 is a schematic diagram illustrating the isolation between the antenna A1 and the antenna A2 of the embodiment depicted in FIG. 1.
Figure 6:
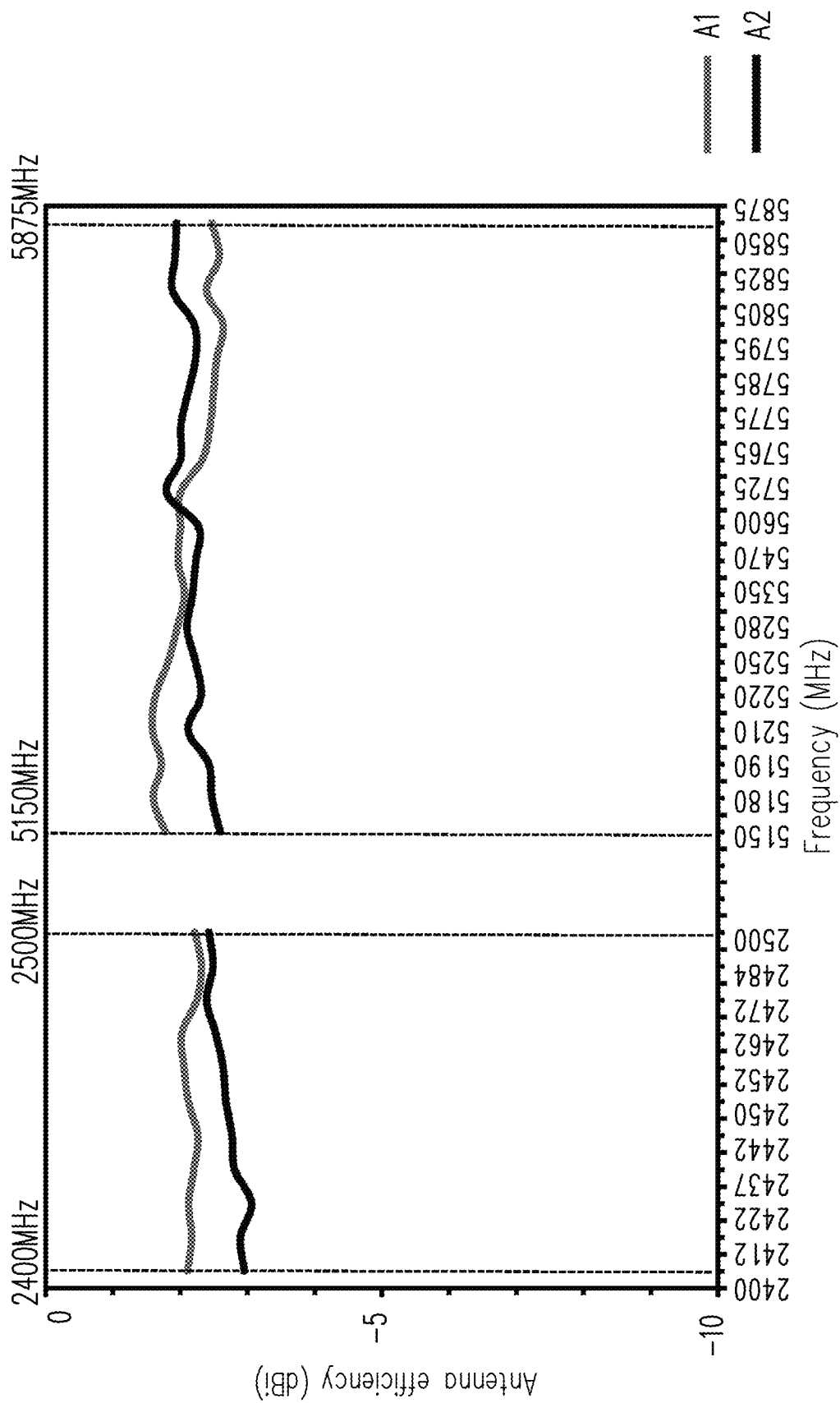
FIG. 6 is a graph illustrating antenna efficiency of each of the antenna A1 and the antenna A2 of the embodiment depicted in FIG. 1.
Figure 7:
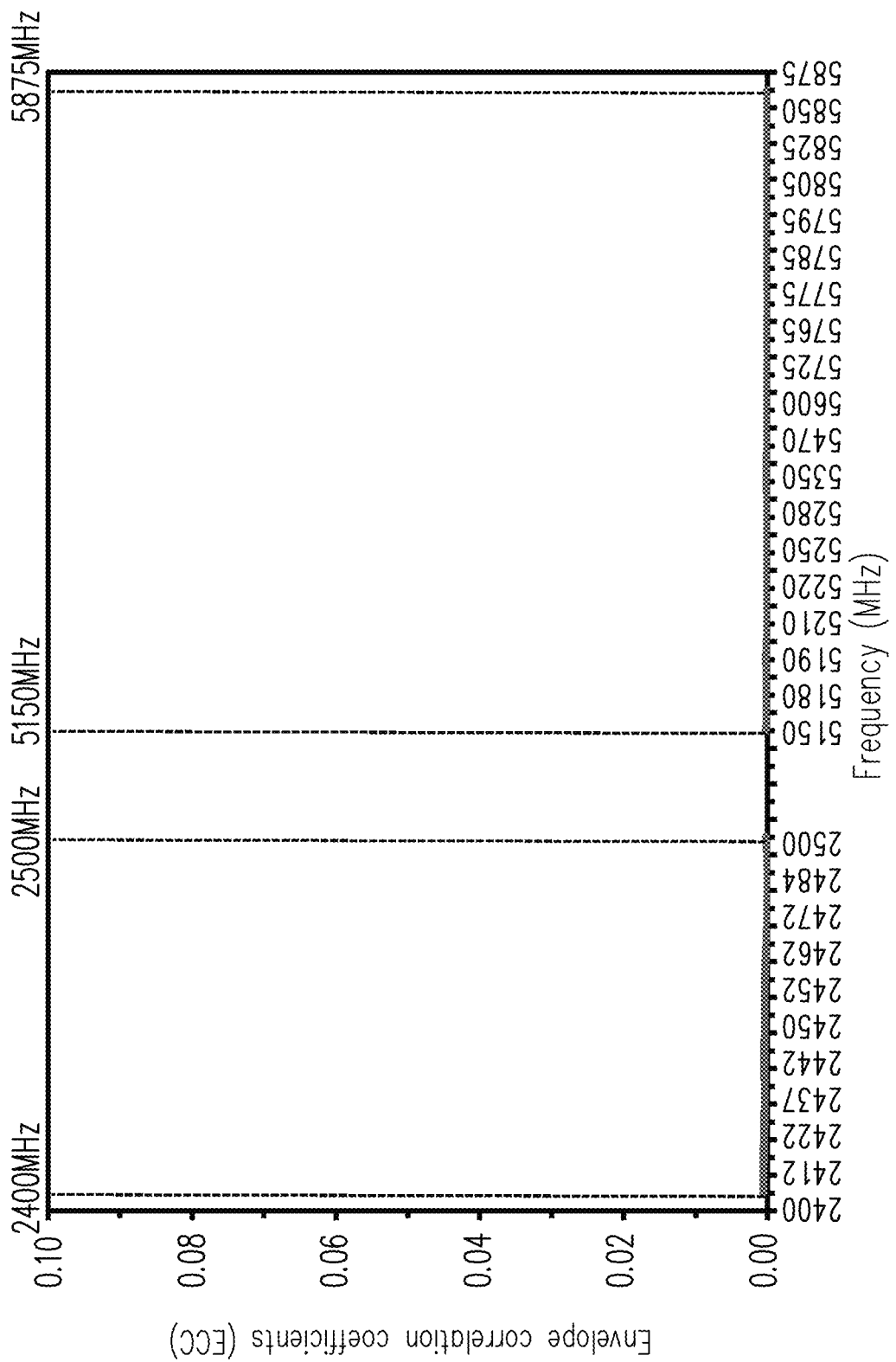
FIG. 7 is a schematic diagram illustrating envelope correlation coefficients (ECCs) of the antenna A1 and the antenna A2 of the embodiment depicted in FIG. 1.
Figure 8:
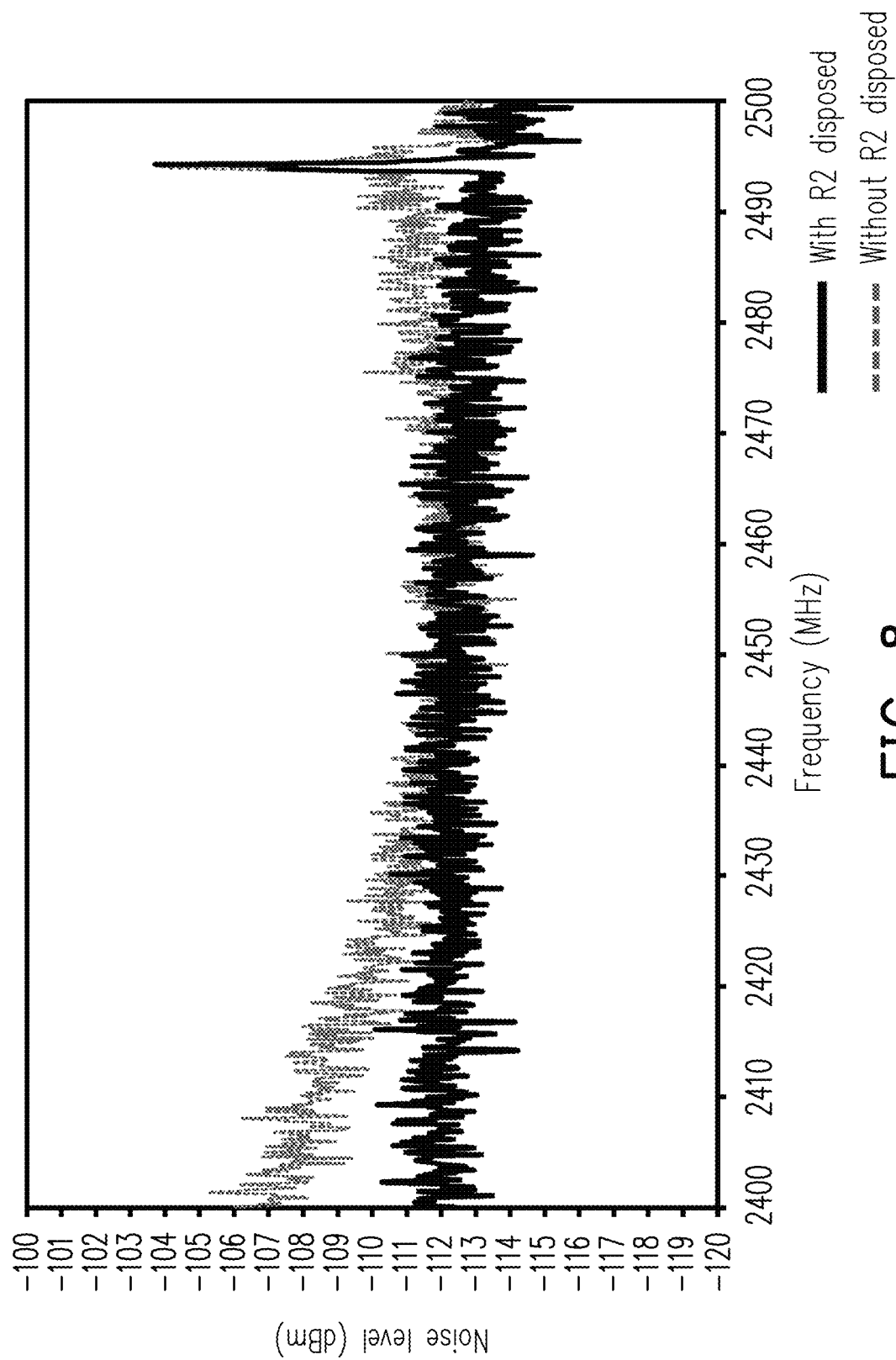
FIG. 8 is a schematic diagram illustrating noise levels corresponding to the antenna A1 of the embodiment depicted in FIG. 1 in scenarios that the retaining wall structure is disposed and that the retaining wall structure is not disposed.
Figure 9:
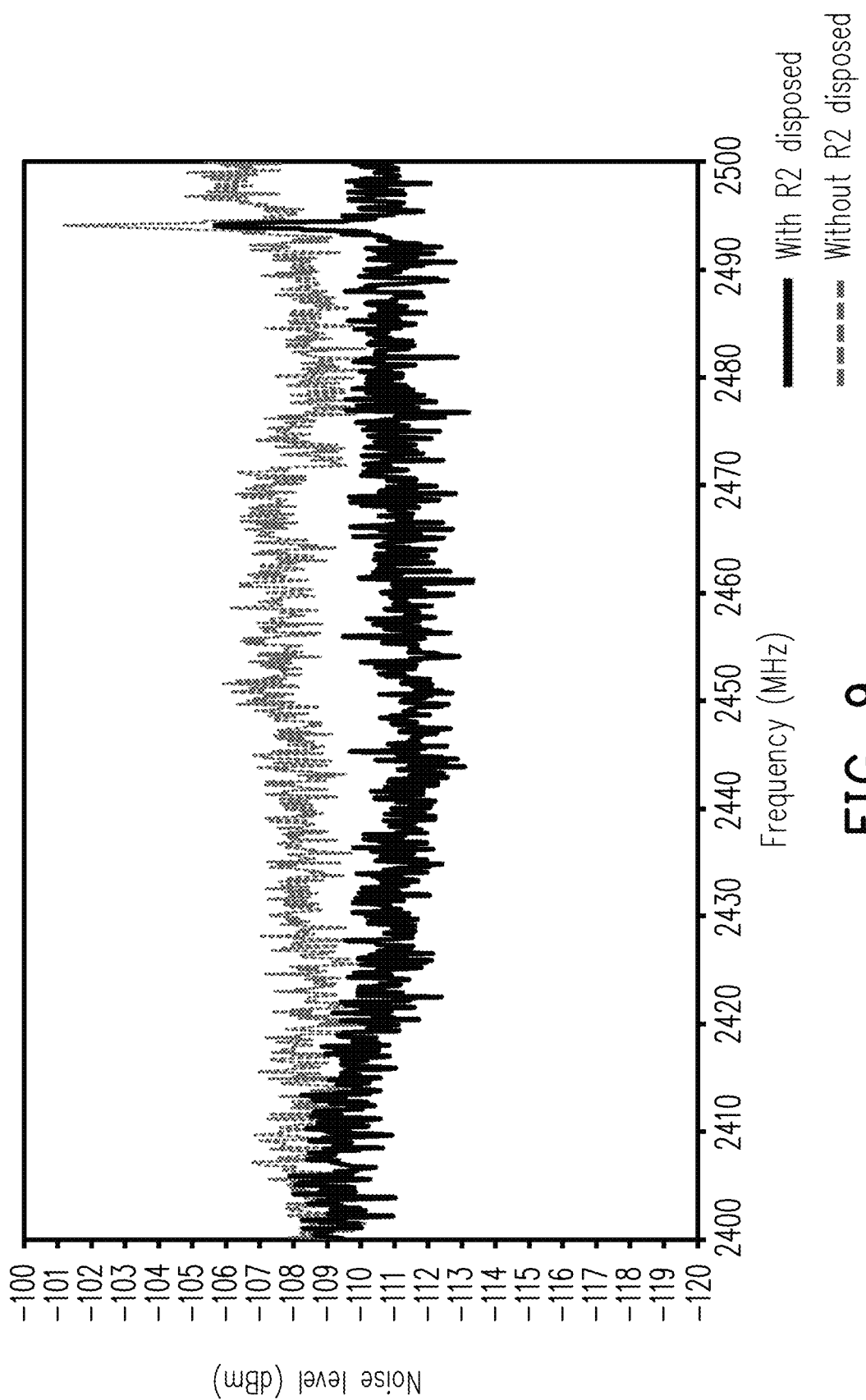
FIG. 9 is a schematic diagram illustrating noise levels corresponding to the antenna A2 the embodiment depicted in FIG. 1 in scenarios that the retaining wall structure is disposed and that the retaining wall structure is not disposed.

FIG. 4 is a graph illustrating voltage standing wave ratios (VWSRs) with respect to a frequency change for the antenna A1 and the antenna A2 of the embodiment depicted in FIG. 1. According to FIG. 4, VWSRs of both the antenna A1 and the antenna A2 may be 2 or less at frequencies of 2.4 GHz and 5 GHz. FIG. 5 is a schematic diagram illustrating the isolation between the antenna A1 and the antenna A2 of the embodiment depicted in FIG. 1. According to FIG. 5, the isolation between the antenna A1 and the antenna A2 may be −20 dB or lower at both of frequencies of 2.4 GHz and 5 GHz (wherein a relative distance between the antenna A1 and the antenna A2 is greater than 200 mm). FIG. 6 is a graph illustrating antenna efficiency of each of the antenna A1 and the antenna A2 of the embodiment depicted in FIG. 1. According to FIG. 6, the antenna efficiency of each of the antenna A1 and the antenna A2 ranges from −2.0 to −3.1 dBi at a frequency of 2.4 GHz, the antenna efficiency ranges from −1.6 to −2.6 dBi at a frequency of 5 GHz, and the antenna efficiency may be −3.5 dBi or more at both of frequencies of 2.4 GHz and 5 GHz, thereby achieving preferable antenna efficiency. FIG. 7 is a schematic diagram illustrating envelope correlation coefficients (ECCs) of the antenna A1 and the antenna A2 of the embodiment depicted in FIG. 1. According to FIG. 7, the ECC of each of the antenna A1 and the antenna A2 may be 0.01 or less. FIG. 8 and FIG. 9 are schematic diagrams illustrating noise levels corresponding to the antennas A1 and A2 the embodiment depicted in FIG. 1 in scenarios that the retaining wall structure is disposed and that the retaining wall structure is not disposed. According to FIG. 8 and FIG. 9, after the retaining wall structure is disposed, a noise level at a frequency of 2.4 GHz may be effectively improved (for about 0.5 to 4 dBm), thereby blocking the noise from affecting the wireless communication quality.

Thus, it may be apparent according to FIG. 4 through FIG. 9 that with the retaining wall structures electrically connected with the ground plane being disposed between the main circuit board and the antenna, the noise generated by the main circuit board of the communication apparatus may be indeed effectively prevented from effecting the antenna performance, so as to enhance the communication quality of the communication apparatus.

Based on the above, in the embodiments of the application, with the retaining wall structure electrically connected with the ground plane being disposed between the main circuit board and the antenna, the shielding metal plate of the top cover and the ground plane of the bottom cover do not have to be electrically connected with each other to omit the ground points designed on the shielding metal plate and the ground plane. Thereby, the design cost can be saved, and the noise generated by the main circuit board of the communication apparatus can be effectively prevented from effecting the antenna performance, so as to enhance the communication quality of the communication apparatus.

Although the application has been described with reference to the above embodiments, it will be apparent to one of the ordinary skill in the art that modifications to the described embodiment may be made without departing from the spirit of the application. Accordingly, the scope of the application will be defined by the attached claims not by the above detailed descriptions.

What is claimed is:

1. A communication apparatus, comprising:
   a display panel;
   a ground plane, disposed opposite to the display panel;
   a shielding metal plate, located between the display panel and the ground plane and stacked on the display panel;
   a main circuit board, located between the shielding metal plate and the ground plane and stacked on the ground plane;
   an antenna; and
   a retaining wall structure, disposed between the main circuit board and the antenna and electrically connected with the ground plane, the retaining wall structure comprising a retaining wall part having a thickness, the retaining wall part being respectively distant from the main circuit board by a first distance, distant from the antenna by a second distance and distant from the shielding metal plate by a third distance, and a projection of the antenna toward the retaining wall part in an orthogonal projection direction falling on the retaining wall part.

2. The communication apparatus according to claim 1, wherein the retaining wall structure is formed by bending a first metal sheet, the retaining wall part has an inverted U-shaped structure comprising a first side portion, a second side portion and a top portion, a distance between the first side portion and the second side portion is equal to the thickness, and the retaining wall structure further comprises:
   a first connection part, electrically connected with the ground plane and the first side portion; and
   a second connection part, electrically connected with the second side portion and the antenna, wherein the first side portion is distant from the main circuit board by the first distance, the second side portion is distant from the antenna by the second distance, and the top portion is distant from the shielding metal plate by the third distance.

3. The communication apparatus according to claim 2, wherein the second side portion and an edge of the shielding metal plate are aligned with each other in a normal direction of the display panel.

4. The communication apparatus according to claim 1, wherein the communication apparatus further comprises:
   a printed circuit board, wherein the antenna is formed on the printed circuit board.

5. The communication apparatus according to claim 2, wherein the communication apparatus further comprises:

a printed circuit board, wherein the antenna is formed on the printed circuit board.

6. The communication apparatus according to claim 4, wherein a height of the retaining wall structure is greater than a height of the printed circuit board by at least one preset height.

7. The communication apparatus according to claim 5, wherein a height of the retaining wall structure is greater than a height of the printed circuit board by at least one preset height.

8. The communication apparatus according to claim 6, wherein the preset height is 5 millimeters (mm).

9. The communication apparatus according to claim 7, wherein the preset height is 5 millimeters (mm).

10. The communication apparatus according to claim 2, further comprising:

a second metal sheet, disposed opposite to the top portion and electrically connected with the ground plane, the first connection part and the second connection part.

11. The communication apparatus according to claim 1, wherein the thickness is greater than or equal to 5 mm.

12. The communication apparatus according to claim 2, wherein the thickness is greater than or equal to 5 mm.

13. The communication apparatus according to claim 1, wherein the first distance and the second distance are greater than or equal to 5 mm.

14. The communication apparatus according to claim 2, wherein the first distance and the second distance are greater than or equal to 5 mm.

15. The communication apparatus according to claim 1, wherein the third distance is greater than 0 mm and less than or equal to 3 mm.

16. The communication apparatus according to claim 2, wherein the third distance is greater than 0 mm and less than or equal to 3 mm.

* * * * *